(12) United States Patent
Haase et al.

(10) Patent No.: US 7,615,501 B2
(45) Date of Patent: Nov. 10, 2009

(54) METHOD FOR MAKING A THIN FILM LAYER

(75) Inventors: Michael A. Haase, St. Paul, MN (US); Paul F. Baude, Maplewood, MN (US); Eric W. Hemmesch, Woodbury, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 456 days.

(21) Appl. No.: 11/201,587

(22) Filed: Aug. 11, 2005

(65) Prior Publication Data

US 2007/0036887 A1 Feb. 15, 2007

(51) Int. Cl.
*H01L 21/31* (2006.01)

(52) U.S. Cl. .................. 438/780; 438/680; 438/758

(58) Field of Classification Search .............. 438/758, 438/780, 421, 680; 427/64, 248, 585, 726, 427/282, 421, 447, 448, 78
See application file for complete search history.

(56) References Cited

U.S. PATENT DOCUMENTS

| | | | |
|---|---|---|---|
| 3,678,889 A | 7/1972 | Murakami et al. | |
| 4,022,928 A | 5/1977 | Piwcyzk | |
| 5,366,764 A | 11/1994 | Sunthankar | |
| 5,554,220 A | 9/1996 | Forrest et al. | |
| 5,679,410 A | 10/1997 | Sugita et al. | |
| 6,030,715 A | 2/2000 | Thompson et al. | |
| 6,150,043 A | 11/2000 | Thompson et al. | |
| 6,242,115 B1 | 6/2001 | Thomson et al. | |
| 6,667,215 B2 | 12/2003 | Theiss et al. | |
| 6,890,627 B2 | 5/2005 | Culver et al. | |
| 6,897,164 B2 * | 5/2005 | Baude et al. | 438/780 |
| 2003/0087471 A1 * | 5/2003 | Shtein et al. | 438/82 |
| 2003/0150384 A1 | 8/2003 | Baude et al. | |
| 2003/0151118 A1 | 8/2003 | Baude et al. | |
| 2003/0230238 A1 | 12/2003 | Papadimitrakopoulos et al. | |
| 2004/0089232 A1 | 5/2004 | Sasaki et al. | |
| 2005/0106322 A1 | 5/2005 | Yamazaki et al. | |
| 2006/0068516 A1 | 3/2006 | Hanaoka et al. | |
| 2006/0071227 A1 * | 4/2006 | Brody et al. | 257/99 |
| 2006/0110904 A1 * | 5/2006 | Conrad | 438/603 |
| 2006/0222780 A1 * | 10/2006 | Gurevich et al. | 427/569 |
| 2007/0202340 A1 * | 8/2007 | Tamitsuji et al. | 428/421 |

FOREIGN PATENT DOCUMENTS

JP    62-136566    6/1987

(Continued)

OTHER PUBLICATIONS

Chen et al., "Recent Developments in Molecular Organic Electroluminescent Materials", Macromol. Symp., (1997), pp. 1-48, vol. 125.
Herman et al., "Molecular Beam Epitaxy", Fundamentals and Current Status, (1989), Springer-Verlag Berlin Heidelberg, New York.
U.S. Appl. No. 10/642,919, entitled "Method for Sealing Thin Film Transistors", filed Aug. 18, 2003.

(Continued)

*Primary Examiner*—Kevin M Picardat
(74) *Attorney, Agent, or Firm*—Harold C. Knecht, III

(57) ABSTRACT

A method of making a patterned layer comprises directing a beam of vaporized material toward a reflector such that the beam of vaporized material impinges an impingement surface of the reflector and is redirected from the reflector through one or more apertures in a shadow mask and onto a deposition substrate to form a patterned material layer.

29 Claims, 4 Drawing Sheets

FOREIGN PATENT DOCUMENTS

| | | |
|---|---|---|
| JP | 4-365852 | 12/1992 |
| JP | 08-199345 | 8/1996 |
| JP | 2000-195673 | 7/2000 |
| JP | 2003-183834 | 7/2003 |
| WO | WO 98/55561 | 12/1998 |
| WO | WO 00/18851 | 4/2000 |
| WO | WO 00/70655 | 11/2000 |

OTHER PUBLICATIONS

U.S. Appl. No. 11/023,141, entitled "Hole Transport Layers for Organic Electroluminescent Devices", filed Dec. 27, 2004.

U.S. Appl. No. 10/991,561, entitled "Electroluminescent Devices Containing Trans-1,2-Bis(Acenyl)Ethylene Compounds", filed Nov. 18, 2004.

* cited by examiner

METHOD FOR MAKING A THIN FILM LAYER

FIELD

This invention relates to methods for making thin film layers that are useful, for example, as layers in electronic devices and, in another aspect, to methods for making patterned layers and a deposition system for making the patterned layers.

BACKGROUND

Many organic materials that are useful as thin films in electronic devices cannot be patterned using photolithography because they are not compatible with photoresist chemicals and processes. Thus, these materials are typically deposited by vapor deposition and patterned using shadow masking techniques to form patterned thin film layers for electronic devices.

It can be difficult, however, to obtain a uniform thin film layer over a relatively large area (that is, an area comparable to the size of the vacuum chamber used for the deposition) by vapor deposition. Using shadow masks for patterning relatively large areas can also be problematic. Often, the organic source materials to be deposited are powders. As illustrated in FIG. 1, a source, typically a Knudsen cell, 14 is used to hold the organic source material. The source material is heated and vaporized into an essentially upward pointing beam 16. A shadow mask 10 must therefore be positioned beneath a deposition substrate 12, with both the deposition substrate 12 and the shadow mask 10 suspended above the source 14. When relatively large polymeric shadow masks are used, however, the shadow mask can sag 17 as a result of gravity, which can lead to imprecise patterning and/or alignment of device layers. A downward pointing beam cannot be utilized, however, because the powder would spill out of a downward facing source.

SUMMARY

In view of the foregoing, we recognize that there is a need for a method for patterning organic thin film layers over a relatively large area. We further recognize that there is a need for a method that can provide uniform thin films over a relatively large area.

Briefly, in one aspect, the present invention provides a method of making a patterned layer. The method comprises directing a beam of vaporized material toward a flux reflector such that the beam of vaporized material impinges an impingement surface of the reflector and is redirected from the reflector through one or more apertures in a shadow mask and onto a deposition substrate to form a patterned material layer. As used herein, "deposition substrate" refers to the actual electronic device substrate (that is, the substrate which typically supports the entire device during manufacturing, testing, and/or use) and any previously deposited layer upon which the source material is to be deposited.

In another aspect, the present invention provides a method of making a thin film layer comprising directing a beam of vaporized material toward a reflector such that the beam of vaporized material impinges the reflector and is redirected onto a deposition substrate to form a thin film layer, wherein the thickness of the thin film layer varies by less than about 8% over an area greater than about 1600 cm$^2$.

In yet another aspect, the present invention provides a method of making a thin film layer comprising (a) directing a beam of vaporized material toward a reflector, (b) allowing the vaporized material to condense on the reflector, and (c) heating the reflector to re-vaporize the material and transfer the material onto a deposition substrate as a thin film layer.

In still another aspect, the present invention provides a deposition system comprising a flux reflector and a shadow mask. The shadow mask can be a polymer shadow mask, and may be supported by (that is, rest upon) a deposition substrate.

The methods of the invention can provide thin film layers, including organic thin film layers, that are uniform over a large area. In addition, as illustrated in FIG. 2, using the methods of the invention, a beam pointing essentially upward 26 from a source 24 can be redirected using reflector 30 into a downward beam 28. This allows a configuration in which the shadow mask 20 rests on the deposition substrate 22, eliminating any sagging of the shadow mask during patterning.

Thus, the methods of the invention meet the need in the art for a method for patterning organic thin film layers over a relatively large area. The methods of the invention also meet the need in the art for a method that can provide uniform organic thin films over a relatively large area.

DETAILED DESCRIPTION

Figure 1:
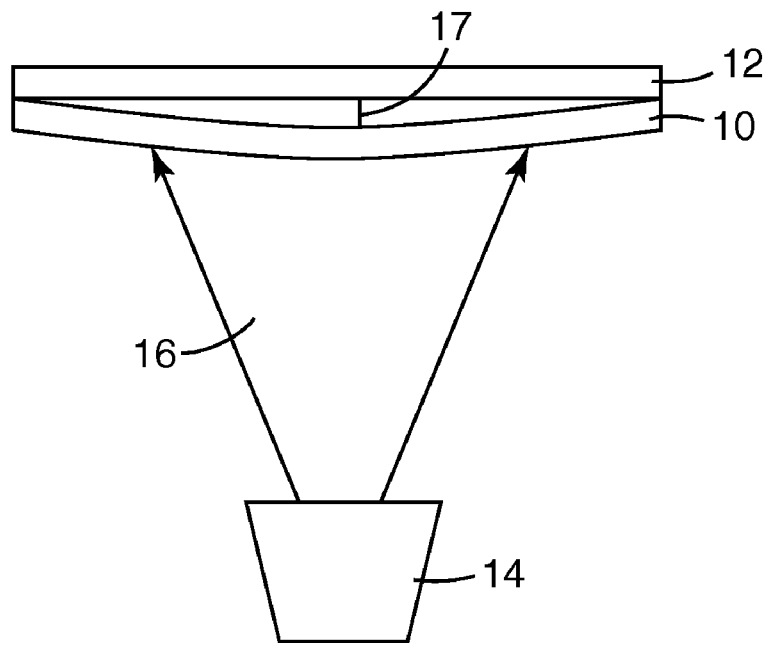
FIG. 1 depicts a known method for making a patterned layer.
Figure 2:
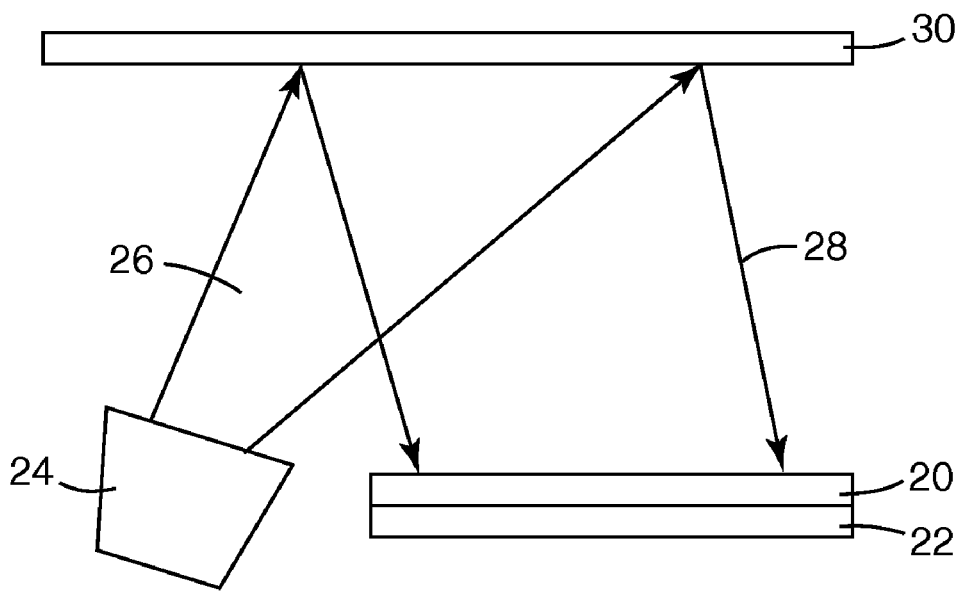
FIG. 2 depicts an embodiment of a method of the invention for making a patterned layer.

Source materials for thin films are typically vapor deposited using a Knudsen cell, although any suitable means for vapor deposition can be utilized with the methods of the invention. When using a Knudsen cell, the material to be deposited is heated to provide a suitable vapor pressure in an isothermal enclosure (the "cell"). Molecular effusion from an aperture in the end of the cell gives rise to a molecular beam of vaporized material. The methods of the invention utilize a flux reflector (also referred to herein simply as a "reflector") to redirect this molecular beam.

Essentially, the Knudsen cell produces a "primary" beam of vaporized material. This primary beam can be directed toward the reflector so that it impinges a surface (the "impingement surface") of the reflector. The vaporized material is then reflected from, or redirected from, the reflector into a "secondary" beam to deposit onto a deposition substrate. The evaporant molecules of the primary beam are essentially randomized when the beam impinges the surface of the reflector so that, from the point of view of the deposition substrate, the reflector appears as a large Lambertian source of vaporized material for the secondary beam. Optionally, the secondary beam can be directed through a shadow mask to pattern the resulting material layer.

The source material can be any useful material that forms a thin film when deposited by vapor deposition. Preferably, the material is organic. More preferably, the material is useful as an organic semiconductor in an organic thin film transistor (TFT) or as a layer in an organic light emitting diode (OLED).

The reflector can be made of any useful material. For example, the reflector can comprise inorganic glasses, ceramic foils, polymeric materials (for example, acrylics, epoxies, polyamides, polycarbonates, polyimides, polyketones, poly(oxy-1,4-phenyleneoxy-1,4-phenylenecarbonyl-1,4-phenylene) (sometimes referred to as poly(ether ether ketone) or PEEK), polynorbornenes, polyphenyleneoxides, poly(ethylene naphthalenedicarboxylate) (PEN), poly(ethylene terephthalate) (PET), poly(phenylene sulfide) (PPS), polytetrafluoroethylene (PTFE)), filled polymeric materials (for example, fiber-reinforced plastics (FRP)), metalized polymers (for example, a polymer film with a metalized surface, a polymer film having a metal layer or pattern on its surface, or a polymer with fine metal particles dispersed therein), or coated or uncoated metal foils. Preferably, the reflector comprises a metal foil, polyimide, or a metalized polymer.

Typically, it is preferable that the vaporized material does not condense upon or stick to the impingement surface of the reflector (that is, the surface that the primary beam impinges and is redirected away from). The impingement surface can therefore be heated (for example, by a lamp) to a temperature above the condensation temperature of the vaporized material. The impingement surface can also be coated with a material (for example, a polymer) to decrease the sticking coefficient of the vaporized material.

In some situations, however, it can be preferable that the source material be retained on the impingement surface for a period of time before being redirected from the reflector. The vaporized source material can, for example, be allowed to condense on the reflector so that the coated reflector can be stored for later use. After the storage period, the coated reflector can be heated to re-vaporize the material and transfer it onto a deposition substrate as a thin film layer.

The reflector can have any useful shape. For example, the reflector can be flat or nonplanar. Preferably, the reflector is nonplanar. Most preferably, the reflector is shaped to maximize the uniformity of the resulting layer. Numerical modeling can be utilized to design the reflector in order to maximize the uniformity of the resulting layer. Numerical modeling can be accomplished using a modeling program such as, for example, Mathcad™ (available from Mathsoft, Cambridge, Mass.). Modeling can also be used to design a reflector that provides, for example, a linearly graded (that is, wedge-shaped) layer.

Reflectors can be made using methods known in the art. For example, metal foils can be shaped or bent (for example, using a preform) to form a reflector. Polymer reflectors can be made, for example, by injection molding.

The secondary beam can be directed through one or more apertures in a shadow mask to pattern the resulting layer. Shadow masks enable deposition of a desired material and, simultaneously, formation of the material in a desired preselected pattern. Accordingly, there is no need for a separate patterning step preceding or following deposition.

Preferably, a shadow mask formed from a polymer material such as, for example, polyimide or polyester is used. Polymer shadow masks typically have a thickness of between about 5 micrometers and about 50 micrometers. The use of polymeric materials for shadow masks can provide advantages over other materials, including ease of fabrication of the shadow mask, reduced cost of the shadow mask, and other advantages. However, non-polymeric materials such as, for example, silicon, metals, or crystalline materials can be used. Polymer shadow masks are flexible and are generally less prone to damage due to the accidental formation of creases or permanent bends, though. In addition, polymer shadow masks, typically being lightweight and flexible, are less damaging when in contact with existing deposited layers. Furthermore, some polymer masks can be cleaned with acids.

The arrangement and shape of deposition apertures are subject to wide variation depending upon the pattern desired. One or more deposition apertures can be formed to have widths less than approximately 1000 micrometers (preferably, less than approximately 50 micrometers; more preferably, less than approximately 20 micrometers; even more preferably, less than approximately 10 micrometers; most preferably, less than approximately 5 micrometers). By forming deposition apertures to have widths in these ranges, the sizes of electronic devices (for example, OLEDs or TFTs) can be reduced. Moreover, a distance (gap) between two deposition apertures can be less than approximately 1000 micrometers (preferably, less than approximately 50 micrometers; more preferably, less than approximately 20 micrometers; most preferably, less than approximately 10 micrometers) to reduce the size of various device elements. When making, using, reusing, or repositioning the shadow masks, the distances between features, such as the distance between apertures or the distance between sub-patterns can be reproducible to within approximately 1.0 percent (preferably, approximately 0.5 percent, more preferably, approximately 0.1 percent).

Laser ablation techniques can be used to define the pattern of deposition apertures in polymer shadow masks. Accordingly, formation of a shadow mask from a polymeric film can allow the use of fabrication processes that can be less expensive, less complicated, and/or more precise than those generally required for other shadow masks such as, for example, silicon masks or metallic masks. Moreover, because laser ablation techniques can be used to create a pattern, the width of the pattern can be made much larger than conventional patterns. For example, laser ablation techniques can facilitate the creation of a pattern such that the width of the pattern is greater than approximately one centimeter, greater than approximately 25 centimeters, greater than approximately 100 centimeters, or even greater than approximately 500 centimeters. These large masks, which can be the width of a web, and very long (for example, the length of a roll), can then be used in a deposition process to create device elements that are distributed over a large surface area and separated by large distances.

Alternatively, if a shadow mask is formed from a silicon wafer, the pattern of apertures can be created using reactive ion etching or laser ablation. Metal masks can be made by a variety of techniques including, for example, conventional machining, micromachining, diamond machining, plasma or reactive ion etching, and electric discharge machining (EDM) or spark-erosion machining.

Typically, the methods of the invention take place in a deposition station such as, for example, a vacuum chamber at a pressure less than about $1 \times 10^{-3}$ torr (preferably, less than about $1 \times 10^{-5}$ torr; more preferably, less than about $1 \times 10^{-6}$ torr). When a shadow mask is used for patterning, the shadow mask is typically placed in proximity to a deposition substrate, and then the material to be deposited is vaporized by a deposition unit. The deposition unit can include one or more sources of deposition material. The source(s) can be heated to vaporize the material. The vaporized material impinges the reflector and is redirected from the reflector to deposit on the deposition substrate through the aperture(s) of the shadow mask. Upon deposition, the material layer forms the pattern defined by the shadow mask.

However, when a flexible shadow mask is made sufficiently large, for example, to include a pattern that has large dimensions, a sag problem can arise as a result of gravity, creating a non-uniform separation between the mask and the deposition substrate. The sag problem compounds as the mask is made larger and larger. Therefore, the mask preferably rests upon the deposition substrate. When a flexible shadow mask is placed upon the deposition substrate, it may not lie perfectly flat upon the substrate (for example, there can be wrinkles in the mask). To overcome this problem, the shadow mask can be stretched against the deposition substrate such that the separation between the mask and the deposition substrate is minimized. In such a configuration, gravity can assist in holding the mask in contact with, or nearly in contact with, the deposition substrate over the entire region in which source material is to be deposited. The separation between the mask and the deposition substrate can be less than, for example, about 10 micrometers (preferably, less than about 2 micrometers) over the entire deposition region.

Structures (for example, a patterned photoresist layer) can optionally be provided on the deposition substrate as a spacer between the deposition substrate and the shadow mask in order to protect previously deposited layers.

The methods of the invention can be used for making thin film layers that are substantially uniform over relatively large areas. For example, the methods of the invention can be used for making thin film layers wherein the thickness of the layer varies by less than about 8% (preferably, less than about 5%; more preferably, less than about 2%) over an area greater than about 1600 $cm^2$ (preferably, over about 1 $m^2$).

The methods of the invention can be performed in-line (that is, continuously). For example, source material can be sequentially deposited onto a deposition substrate of an elongated web. The substrate web can be fed through a series of deposition stations. The reflector can also be formed from an elongated web and/or moved through a series of deposition stations. In addition, shadow mask patterns can be formed in webs to define thin film layers or portions of layers.

The thin film layers are useful in electronic devices such as, for example, capacitors, transistors (of which there are many types, including junction transistors and thin film transistors), diodes (for example, light emitting diodes or Schottky diodes), photovoltaics, and displays. Preferably, the methods of the invention can be used for making organic thin film layers for organic electronic devices; most preferably, the methods of the invention can be used for making organic thin film layers for organic light emitting diodes (OLEDs) and organic thin film transistors (TFTs).

OLEDs include an organic emissive element positioned between two electrodes (that is, an anode and a cathode). The organic emissive element typically includes at least one light emitting layer that contains one or more organic electroluminescent materials. The organic emissive element can also include other optional materials such as, for example, charge transport materials, charge blocking materials, charge injection materials, color conversion materials, buffer materials, or a combination thereof.

Typically, OLEDs are provided on a substrate and arranged in the following order: anode, a hole transport layer, light emitting layer, electron transport layer, and cathode. Electrons are injected into the electron transporting layer from the cathode and holes are injected into the hole transporting layer from the anode. The charge carriers migrate to the light emitting layer where they combine to emit light. At least one electrode is usually transparent (that is, the light can be emitted through the transparent electrode).

A typical anode for an OLED is indium-tin-oxide (ITO) sputtered onto a transparent substrate such as plastic or glass. Suitable substrates include, for example, glass, transparent plastics such as polyolefins, polyethersulfones, polycarbonates, polyesters, polyarylates, and polymeric multilayer films, ITO coated barrier films such as the Plastic Film Conductor available from 3M (St. Paul, Minn.), surface-treated films, and selected polyimides.

The anode material coating the substrate is electrically conductive and may be optically transparent, semi-transparent, or opaque. In addition to ITO, suitable anode materials include, for example, indium oxide, fluorine tin oxide (FTO), zinc oxide, indium zinc oxide (IZO), vanadium oxide, zinc-tin oxide, gold, platinum, palladium, silver, other high work function metals, and combinations thereof. Many suitable anodes have a surface that contains one or more metal oxides.

Typical cathodes include low work function metals such as aluminum, barium, calcium, samarium, magnesium, silver, magnesium/silver alloys, lithium, lithium fluoride, ytterbium, and of calcium/magnesium alloys. The cathode can be a single layer or multiple layers of these materials. For example, the cathode can include a layer of lithium fluoride, a layer of aluminum, and a layer of silver.

The anode and the cathode can be deposited using a reflector (and optionally patterned using a shadow mask) according to the methods of the invention. They can also be deposited using any other useful method such as, for example, by plating, ink jet printing, or vapor deposition (for example, thermal evaporation or sputtering).

The hole transport layer facilitates the injection of holes from the anode into the device and their migration towards the recombination zone within the light emitting layer. The hole transport layer can further act as a barrier for the passage of electrons to the anode.

Suitable hole transport layers include, for example, diamine derivatives such as N,N'-bis(3-methylphenyl)-N,N'-bis(phenyl)benzidine (TPD), N,N'-bis(2-naphthyl)-N,N'-bis(phenyl)benzidine (beta-NPB), N,N'-bis(l-naphthyl)-N,N'-bis(phenyl)benzidine (NPB), and the like; and triarylamine derivatives such as, 4,4',4"-tris(N,N-diphenylamino)triphenylamine (TDATA), 4,4',4"-tris(N-3-methylphenyl-N-phenylamino)triphenylamine (MTDATA), 4,4',4"-tri(N-phenoxazinyl)triphenylamine (TPOTA), 1,3,5-tris(4-diphenylaminophenyl)benzene (TDAPB), and the like.

The hole transport layer can be deposited using a reflector (and optionally patterned using a shadow mask) according to the methods of the invention, or using any suitable method.

OLEDs contain one or more light emitting layers. Some light emitting layers have a small molecule emitter, a small molecule emitter doped light emitting polymer, a blend of light emitting polymers, or a combination thereof. The emitted light from the organic emissive element can be in any portion of the spectrum depending on the composition of the materials in the light emitting layer or layers.

The light emitting layer(s) can be deposited using a reflector (and optionally patterned using a shadow mask) according to the methods of the invention, or using any suitable method. The methods of the invention can be used to pattern two or more light emitting layers to form regions that emit light at different colors in order to form multi-color or full color displays.

In practice, multiple layers of small molecule materials are typically used to produce efficient organic electroluminescent devices since a given material generally does not have both the desired charge transport and electroluminescent properties.

Exemplary small molecule materials include N,N'-bis(3-methylphenyl)-N,N'-diphenylbenzidine (TPD) and metal chelate compounds such as tris(8-hydroxyquinoline)aluminum (Alq3). Other small molecule materials are disclosed in, for example, C. H. Chen, et al., *Macromol. Symp.* 125, 1 (1997); Japanese Laid Open Patent Application 2000-195673; U.S. Pat. Nos. 6,030,715; 6,150,043; and 6,242,115; and PCT Patent Applications Publication Nos. WO 00/18851 (divalent lanthanide metal complexes), WO 00/70655 (cyclometallated iridium compounds and others), and WO 98/55561. Some of these small molecules can be fluorescent and/or phosphorescent.

The light emitting layer can contain a host material in combination with a dopant. The excited state of the host material is typically at a higher energy level than the excited state of the dopant so that energy can be transferred from the host material to the dopant. The excited host material typically emits light of a shorter wavelength than the excited dopant. For example, host material that emits blue light can transfer energy to a dopant that emits green or red light and a host material that emits green light can transfer energy to a dopant that emits red light but not to a dopant that emits blue light. Exemplary host material and dopant combinations include, but are not limited to, tris(8-hydroxyquinolato)aluminum (Alq3) doped with coumarin dyes and biphenylato bis(8-hydroxyquinolato)aluminum (BAlq) doped with rubrene.

The electron transport layer facilitates the injection of electrons from the cathode into the device and migration of electrons towards the recombination zone within the light emitting layer. The electron transport layer can further act as a barrier for the passage of holes to the cathode. In some examples, the electron transport layer can be formed using an organometallic compound such as tris(8-hydroxyquinolato) aluminum (Alq3) and biphenylato bis(8-hydroxyquinolato) aluminum (BAlq). Other examples of electron transport materials useful in an electron transport layer include 1,3-bis [5-(4-(1,1-dimethylethyl)phenyl)-1,3,4-oxadiazol-2-yl]benzene; 2-(biphenyl-4-yl)-5-(4-(1,1-dimethylethyl)phenyl)-1,3,4-oxadiazole; 9,10-di(2-naphthyl)anthracene (ADN); 2-(4-biphenyl)-5-(4-t-butylphenyl)-1,3,4-oxadiazole; or 3-(4-biphenylyl)-4-phenyl-5-(4-tert-butylphenyl)-1,2,4-triazole (TAZ).

The electron transport layer can be deposited using a reflector (and optionally patterned using a shadow mask) according to the methods of the invention, or using any suitable method.

Other layers such as additional hole injection layers containing, for example, porphyrinic compounds like copper phthalocyanine (CuPc) or zinc phthalocyanine; electron injection layers containing, for example, alkaline metal oxides or alkaline metal salts; hole blocking layers containing, for example, molecular oxadiazole or triazole derivatives such as 2-(4-biphenyl)-5-(4-t-butylphenyl)-1,3,4-oxadiazole (PBD), 2,9-dimethyl-4,7-diphenyl-1,10-phenanthraline (BCP), biphenylato bis(8-hydroxyquinolato)aluminum (BAlq), or 3-(4-biphenylyl)-4-phenyl-5-(4-tert-butylphenyl)-1,2,4-triazole (TAZ); electron blocking layers containing, for example, N,N'-bis(1-naphthyl)-N,N'-bis(phenyl)benzidine (NPB), or 4,4',4"-tris(N-(3-methylphenyl)-N-phenylamino)triphenylamine (MTDATA); or the like can also be present in organic emissive element. In addition, photoluminescent materials can be present in these layers, for example, to convert the color of light emitted by the electroluminescent material to another color. These and other such layers and materials can be used to alter or tune the electronic properties and behavior of the layered OLED device, for example, to achieve one or more features such as a desired current/voltage response, a desired device efficiency, a desired color, a desired brightness, a desired device lifetime, or a desired combination of these features.

These layers can be deposited using a reflector (and optionally patterned using a shadow mask) according to the methods of the invention, or using any suitable method.

The OLED is typically disposed on a substrate ("OLED substrate"). The OLED substrate can comprise any suitable material such as, for example, glass, polymeric, or other suitable materials that are substantially transparent to visible light. Suitable substrates can be clear, transparent or translucent, rigid or flexible, filled or unfilled. The OLED substrate can also be opaque to visible light, for example stainless steel, crystalline silicon, amorphous silicon, poly-silicon, or the like.

TFTs are another particularly useful type of electronic device. TFTs generally include a transistor substrate, a gate electrode on the transistor substrate, a gate dielectric on the gate electrode, a source and a drain electrode adjacent to the gate dielectric, and a semiconductor layer adjacent to the gate dielectric and adjacent to the source and drain electrodes. These components can be assembled in a variety of configurations. For example, the source and drain electrodes can be adjacent to the gate dielectric with the semiconductor layer over the source and drain electrodes, or the semiconductor layer can be interposed between the source and drain electrodes and the gate dielectric.

TFTs made according to the present invention can be provided on a substrate ("transistor substrate"). The transistor substrate typically supports the TFT during manufacturing, testing, and/or use. For example, one transistor substrate may be selected for testing or screening various embodiments while another transistor substrate is selected for commercial embodiments. Optionally, the transistor substrate can provide an electrical function for the TFT. Useful transistor substrate materials include organic and inorganic materials. For example, the transistor substrate can comprise inorganic glasses, ceramic foils, polymeric materials (for example, acrylics, epoxies, polyamides, polycarbonates, polyimides, polyketones, poly(oxy-1,4-phenyleneoxy-1,4-phenylenecarbonyl-1,4-phenylene) (sometimes referred to as poly(ether ether ketone) or PEEK), polynorbornenes, polyphenyleneoxides, poly(ethylene naphthalenedicarboxylate) (PEN), poly (ethylene terephthalate) (PET), poly(phenylene sulfide) (PPS)), filled polymeric materials (for example, fiber-reinforced plastics (FRP)), fibrous materials, such as paper and textiles, and coated or uncoated metallic foils. Preferably, the transistor substrate comprises a polymeric material.

A flexible transistor substrate can be used with the present invention. A flexible transistor substrate allows for roll processing, which may be continuous, providing economy of scale and economy of manufacturing over flat and/or rigid substrates. The preferred flexible transistor substrate can be rolled upon itself.

The gate electrode of a TFT can be any useful conductive material. For example, the gate electrode can comprise doped silicon, or a metal, such as aluminum, copper, chromium, gold, silver, nickel, palladium, platinum, tantalum, and titanium, and transparent conducting oxides such as indium tin oxide or a doped zinc oxide (for example, aluminum doped zinc oxide or gallium doped zinc oxide).

Conductive polymers also can be used, for example polyaniline or poly(3,4-ethylenedioxythiophene)/poly(styrene sulfonate) (PEDOT:PSS). In addition, alloys, combinations, and multilayers of these materials can be useful. In some TFTs, the same material can provide the gate electrode function and also provide the support function of a transistor substrate. For example, doped silicon can function as the gate electrode and support the TFT.

The gate dielectric electrically insulates the gate electrode from the balance of the TFT device. The gate dielectric preferably has a relative dielectric constant above about 2 (more preferably, above about 5). The dielectric constant of the gate dielectric can be relatively high, for example, 80 to 100 or higher. Useful materials for the gate dielectric can comprise, for example, organic or inorganic electrically insulating materials.

Specific examples of organic materials useful for the gate dielectric include polymeric materials, such as polyvinylidenefluoride (PVDF), cyanocelluloses, polyimides, epoxies, and the like. Specific examples of inorganic materials useful for the gate dielectric include strontiates, tantalates, titanates, zirconates, aluminum oxides, silicon oxides, tantalum oxides, titanium oxides, silicon nitrides, barium titanate, barium strontium titanate, and barium zirconate titanate. In addition, alloys, combinations, and multilayers of these materials can be used for the gate dielectric.

The source and drain electrodes of a TFT are separated from the gate electrode by the gate dielectric, while the semiconductor layer can be over or under the source electrode and drain electrode. The source and drain electrodes can be any useful conductive material. Useful materials include most of those materials described above for the gate electrode, for example, aluminum, barium, calcium, chromium, copper, gold, silver, nickel, palladium, platinum, titanium, transparent conducting oxides such as indium tin oxide or a doped zinc oxide (for example, aluminum doped zinc oxide or gallium doped zinc oxide), polyaniline, PEDOT:PSS, other conducting polymers, alloys thereof, combinations thereof, and multilayers thereof.

The semiconductor layer can comprise organic or inorganic semiconductor materials (preferably, organic semiconductor materials). Useful inorganic semiconductor materials include amorphous silicon, tellurium, zinc oxide, zinc selenide, zinc sulfide, cadmium sulfide, and cadmium selenide (preferably, amorphous silicon). Useful organic semiconductor materials include acenes and substituted derivatives thereof. Particular examples of acenes include anthracene, naphthalene, tetracene, pentacene, and substituted pentacenes (preferably pentacene or substituted pentacenes, including fluorinated pentacenes). Other examples include semiconducting polymers, perylenes, fullerenes, phthalocyanines, oligothiophenes, polythiophenes, polyphenylvinylenes, polyacetylenes, metallophthalocyanines and substituted derivatives.

The thin film electrodes (that is, the gate electrode, source electrode, and drain electrode), the gate dielectric, and/or the semiconductor layer can be provided using the methods of the invention.

The TFT layers can also be provided by other useful methods. The thin film electrodes, for example, can also be provided by any useful means such as, for example, by plating, ink jet printing, or vapor deposition (for example, thermal evaporation or sputtering). The semiconductor layer can be provided by any useful means such as, for example, solution deposition, spin coating, printing techniques, or vapor deposition. The gate dielectric can also be provided by any useful means such as, for example vapor deposition or plasma-based deposition.

The patterning of the thin film electrodes and the semiconductor layer can be accomplished by known methods such as shadow masking, additive photolithography, subtractive photolithography, printing, microcontact printing, and pattern coating (preferably, by shadow masking).

In some situations, one or more, or all of, the gate electrode, gate dielectric, semiconductor layer, source electrode and drain electrode, and sealing material can each be vapor deposited using a reflector according to the methods of the invention. In addition, multiple patterns can be used comprising one or more shadow masks for deposition of the component layers. Individual layers can be deposited through the same or different patterns on one or more shadow masks.

EXAMPLES

Objects and advantages of this invention are further illustrated by the following examples, but the particular materials and amounts thereof recited in these examples, as well as other conditions and details, should not be construed to unduly limit this invention.

Example 1

A 15 cm×18 cm polyimide shadow mask (see, for example, U.S. Patent Application Publication No. 2003/0150384 (Baude et al.)) was placed on top of a 15 cm×18 cm glass substrate and placed in a vacuum chamber. The shadow mask had a pattern of 90 μm square apertures separated by 90 μm. An approximately 25 cm×46 cm planar piece of ultra high vacuum-compatible aluminum foil (UHV Foil available from All-Foils, Inc., Cleveland, Ohio) was positioned 25 cm above the substrate. The foil was heated with a 500 W quartz lamp controlled by a Variac (Staco variable transformer) to serve as a flux reflector. A thickness monitor (Inficon XTC/2, available from Inficon, East Syracuse, N.Y.) was placed near the flux reflector facing downward to measure the primary flux. A second Inficon XTC/2 thickness monitor was placed near the substrate facing upward to measure the secondary (redirected) flux.

Figure 3:
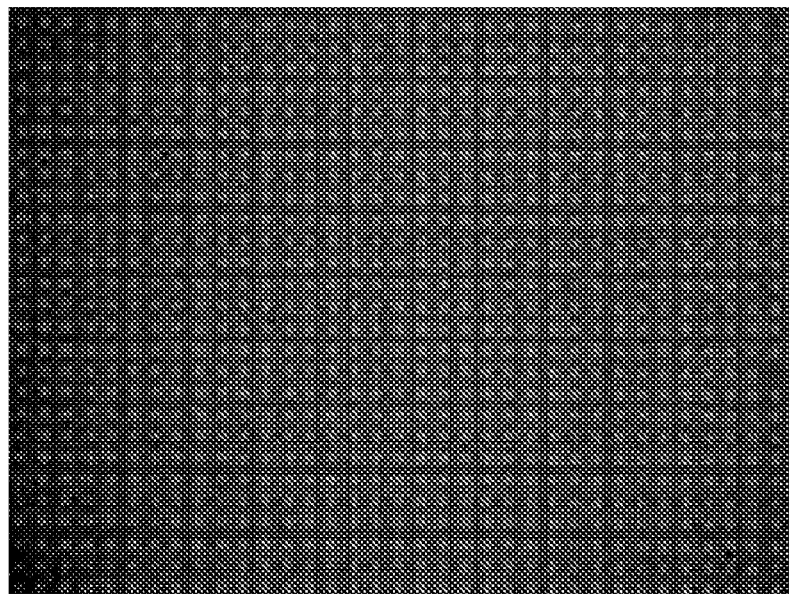
FIG. 3 is a photomicrograph taken using a 20× objective showing a top view of a patterned layer made using a method of the invention.
Figure 4:
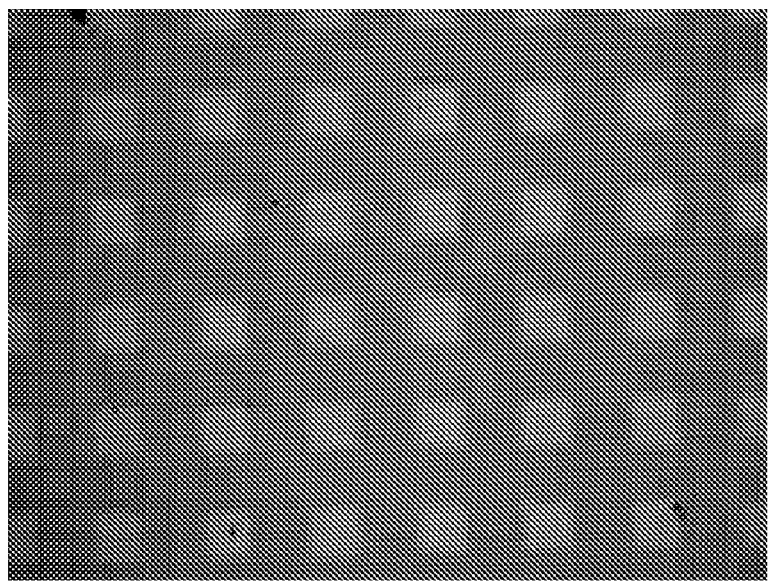
FIG. 4 is a photomicrograph taken using a 100× objective showing a top view of a patterned layer made using a method of the invention.

A primary beam of tris(8-hydroxyquinoline)aluminum (Alq) was thermally evaporated from an alumina crucible located beside the substrate at a rate of 6.5 Å/sec (peak) and 3.0 Å/sec (stable) at an angle of approximately 30 degrees from vertical towards the reflector. The redirected secondary beam of Alq was deposited on the substrate and shadow mask at a rate of 1.5 Å/sec (peak) and 0.5 Å/sec (stable). A total of 370 Å Alq was deposited on the glass substrate in a uniform manner. The pattern of the deposition through the shadow mask was visible by fluorescence from a shortwave UV light and through a light microscope. Photomicrographs of the pattern were taken using a 20× objective and a 100× objective with a Sony Exwave HAD color digital camera (available from Sony USA). The photomicrographs are shown in FIGS. 3 and 4 respectively. The patterned squares are 90 micrometers on each side.

Example 2

Figure 5A:
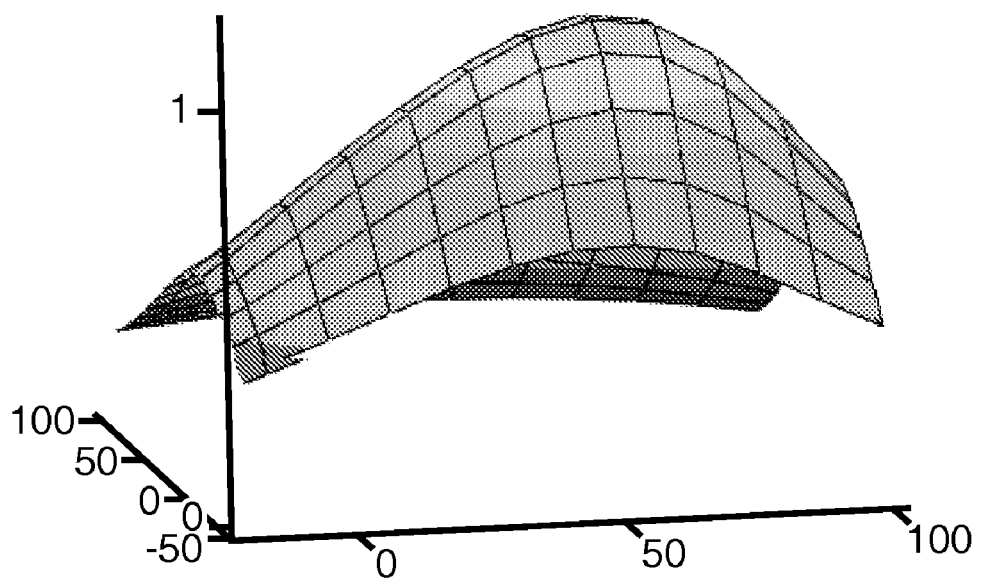
FIGS. 5(a) and (b) are graphical representations of the theoretical fluxes of a primary beam and a redirected secondary beam.
Figure 5B:
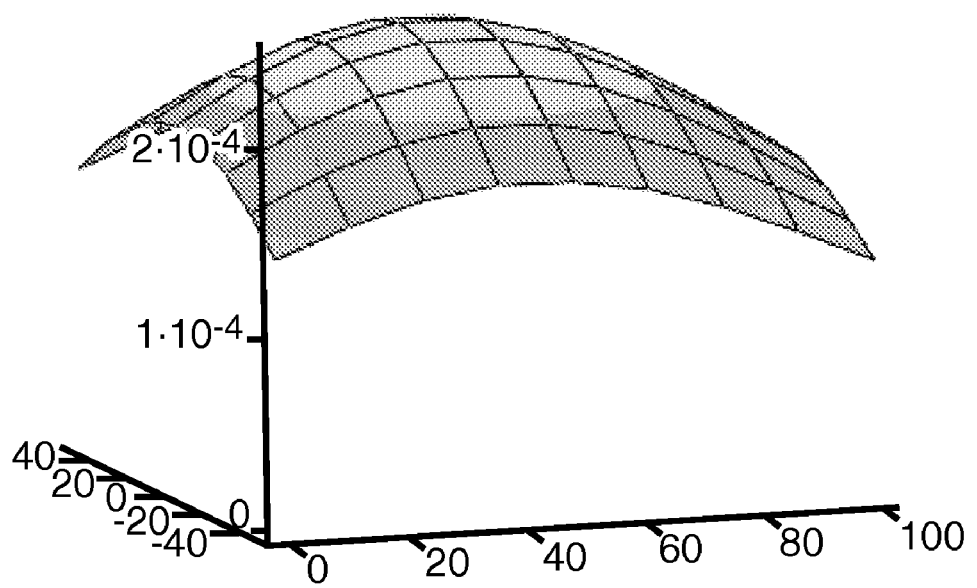

Numerical modeling of the flux reflector performance was accomplished using MathCad™ (available from Mathsoft, Cambridge, Mass.). The primary beam was calculated using Dayton's modification to the Clausing formula for a Knudsen cell (see, for example, *Molecular Beam Epitaxy, Fundamentals and Current Status*, M. A. Herman and H. Sitter (Springer-Verlag, 1989)). This model was used to calculate the theoretical flux impinging at various points on the flux reflector. The flux reflector was treated as a lambertian re-evaporation source. A 2-dimensional integration allowed the calculation of the theoretical flux of the resulting secondary beam (the beam redirected by the flux reflector) impinging at any point on the substrate. The 3-D graphs generated by MathCad™ (FIGS. 5(a) and (b)) show the calculated theoretical primary and secondary flux for a system in which a planar flux reflector is 1 m above the substrate and Knudsen cell, and the Knudsen cell is located at the center of one edge of the substrate. The vertical axis is in arbitrary units of flux (for example, Å/sec) and the horizontal axes are in cm. The graphs show that the theoretical deposition was relatively uniform over a large substrate area (less than ±8% variation over an 80 cm×80 cm region (1600 cm² area)).

Example 3

Figure 6:
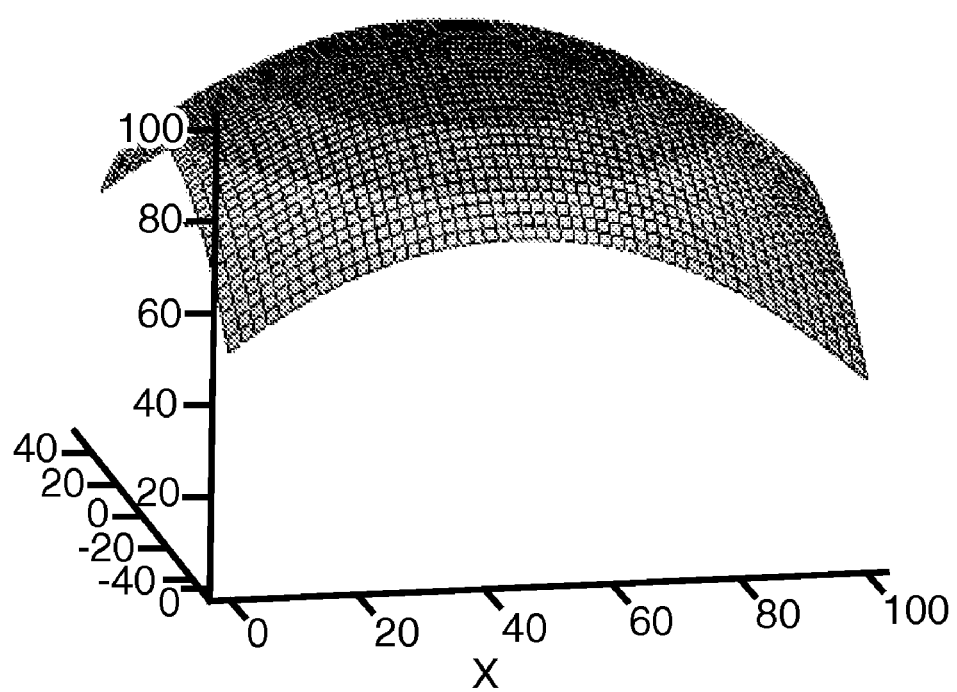
FIG. 6 depicts a non-planar reflector.
Figure 7:
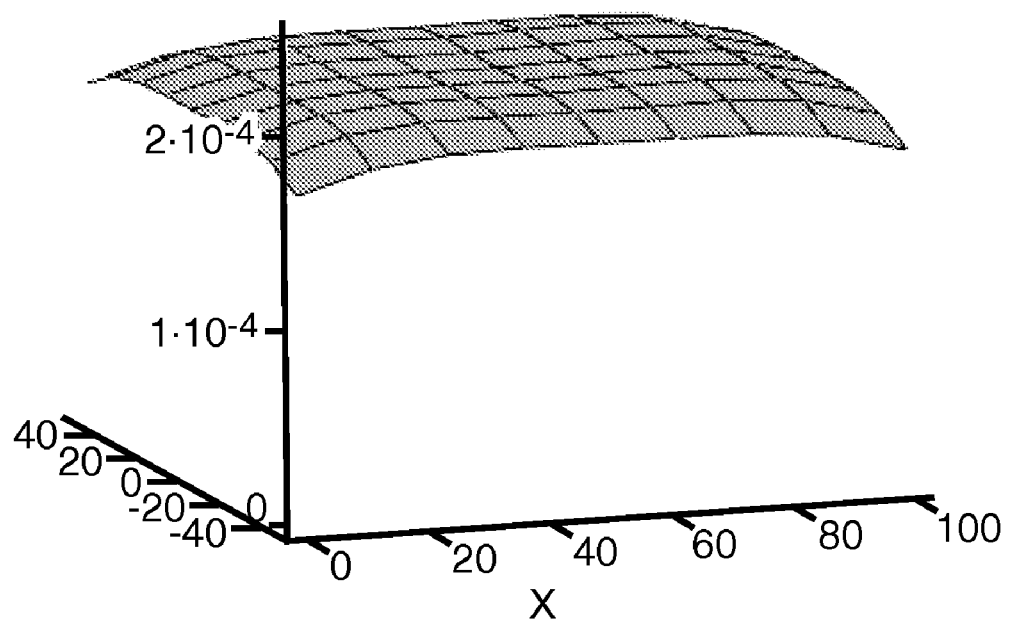
FIG. 7 is a graphical representation of the theoretical flux of a redirected secondary beam.

Increased uniformity and/or efficiency can be attained by appropriately shaping the flux reflector surface. FIG. 6 shows an alternative flux reflector shaped as a curved surface, the surface in this example being defined by the equation:

$$Z_{fr}(x, y) := 100 - \left(\frac{x - M_x}{C_x}\right)^2 - \left(\frac{y}{C_y}\right)^2,$$

where $Z_{fr}$ is the height of the surface at a point (x,y) in centimeters, and $M_x$, $C_x$, and $C_y$ are constants. In this example $M_x$=44.5 cm, $C_x$=$C_y$=9.5 cm. This reflector was designed by trial and error using MathCad™ essentially as described above. FIG. 7 shows the theoretical secondary flux resulting from this shaped flux reflector (calculated as described above). The theoretical deposition is uniform, achieving less than ±2% variation over an 80 cm×80 cm region (1600 cm² area).

The complete disclosures of the publications cited herein are incorporated by reference in their entirety as if each were individually incorporated. Various modifications and alterations to this invention will become apparent to those skilled in the art without departing from the scope and spirit of this invention. It should be understood that this invention is not intended to be unduly limited by the illustrative embodiments and examples set forth herein and that such examples and embodiments are presented by way of example only with the scope of the invention intended to be limited only by the claims set forth herein as follows.

We claim:

1. A method of making a patterned layer comprising:
    directing a beam of vaporized material toward a reflector such that the beam of vaporized material impinges an impingement surface of the reflector and is redirected from the reflector through one or more apertures in a shadow mask and onto a deposition substrate to form a patterned material layer, wherein the shadow mask rests upon the deposition substrate, and the deposition substrate is a substrate for an electronic device.
2. The method of claim 1 wherein the vaporized material is organic.
3. The method of claim 1 wherein the method is carried out at a pressure less than about 1×10⁻³ torr.
4. The method of claim 1 wherein the reflector comprises a metal foil.
5. The method of claim 1 wherein the impingement surface is coated with a polymer so as to decrease the sticking coefficient of the vaporized material.
6. The method of claim 1 wherein the shadow mask is a polymeric shadow mask.
7. The method of claim 1 wherein the patterned material layer is a layer of an electronic device.
8. The method of claim 7 wherein the electronic device is an organic electronic device.
9. The method of claim 8 wherein the organic electronic device is an organic light emitting diode or an organic thin film transistor.
10. The method of claim 1 wherein the beam of vaporized material impinges the impingement surface of the reflector and is retained on the impingement surface before being redirected from the reflector through one or more apertures in a shadow mask.
11. The method of claim 1 wherein the shadow mask rests upon the deposition substrate such that gravity holds the shadow mask in contact with the deposition substrate.
12. The method of claim 11 wherein the width of the pattern is greater than approximately 25 centimeters.
13. The method of claim 1 wherein the deposition substrate is an elongated web.
14. The method of claim 1 wherein the deposition substrate is a substrate for an electronic device selected from a capacitor, transistor, diode, photovoltaic, and display.
15. The method of claim 1 wherein the deposition substrate is made of plastic or glass.
16. The method of claim 15 wherein the deposition substrate is substantially transparent to visible light.
17. The method of claim 1 wherein the deposition substrate is opaque to visible light.
18. The method of claim 1 wherein the deposition substrate is an OLED substrate or a TFT substrate.
19. The method of claim 1 wherein the deposition substrate is a transistor substrate that comprises a material selected from inorganic glass, ceramic foil, polymeric material, filled polymeric material, fibrous material, and coated or uncoated metallic coil.
20. The method of claim 1 wherein the deposition substrate is a flexible transistor substrate that can be roll processed.
21. The method of claim 1 wherein the deposition substrate is a flexible substrate, and said method comprises:
    roll processing the deposition substrate during said directing.
22. The method of claim 1 wherein the shadow mask is a flexible shadow mask, and said method further comprises:
    stretching the shadow mask against the deposition substrate so as to eliminate wrinkles in the shadow mask.
23. A method of making a thin film layer comprising:
    directing a beam of vaporized material toward a reflector such that the beam of vaporized material impinges the reflector and is redirected unto a deposition substrate to form a thin film layer, wherein the deposition substrate is a substrate for an electronic device, and the thickness of the thin film layer varies by less than about 8% over an area greater than about 1600 cm².
24. The method of claim 23 wherein the vaporized material is redirected through one or more apertures in a shadow mask to form a patterned thin film layer.
25. A method of making a thin film layer comprising:
    (a) directing a beam of vaporized material toward a reflector, where the reflector is at a first temperature;
    (b) allowing the vaporized material to condense on the reflector; and
    (c) increasing the temperature of the reflector to a higher temperature than the first temperature in order to re-vaporize the material condensed on the reflector and transfer the material onto a deposition substrate as a thin film layer.

26. The method of claim 25 wherein the vaporized material, is organic.

27. The method of claim 25 wherein a shadow mask is used to pattern the thin film layer.

28. A deposition system comprising a flux reflector, a deposition substrate and a shadow mask, wherein the deposition substrate is a substrate for an electronic device, and the shadow mask rests upon the deposition substrate such that gravity holds the shadow mask in contact with the deposition substrate.

29. The deposition system of claim 28 wherein the shadow mask is a polymeric shadow mask.

\* \* \* \* \*

UNITED STATES PATENT AND TRADEMARK OFFICE
CERTIFICATE OF CORRECTION

PATENT NO.       : 7,615,501 B2
APPLICATION NO.  : 11/201587
DATED            : November 10, 2009
INVENTOR(S)      : Michael A. Haase It is certified that error appears in the above-identified patent and that said Letters Patent is hereby corrected as shown below:

Column 6

Line 42; delete "bis(l-naphthyl)" and insert -- bis(1-naphthyl) --, therefor.

Column 12

Line 38; Claim 19, delete "coil." and insert -- foil. --, therefor.

Column 12

Line 53 (Approx.); Claim 23, delete "unto" and insert -- onto --, therefor.

Column 13

Line 4-5; Claim 26, delete "material," and insert -- material --, therefor.

Signed and Sealed this

Sixteenth Day of February, 2010

David J. Kappos
*Director of the United States Patent and Trademark Office*

UNITED STATES PATENT AND TRADEMARK OFFICE
CERTIFICATE OF CORRECTION

PATENT NO.       : 7,615,501 B2
APPLICATION NO.  : 11/201587
DATED            : November 10, 2009
INVENTOR(S)      : Haase et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 858 days.

Signed and Sealed this

Nineteenth Day of October, 2010

David J. Kappos
*Director of the United States Patent and Trademark Office*